United States Patent [19]
Abe et al.

[11] Patent Number: 5,794,130
[45] Date of Patent: Aug. 11, 1998

[54] WIRELESS COMMUNICATION SYSTEM HAVING IMPROVED PLL CIRCUITS

[75] Inventors: Tsutomu Abe; Takayuki Kobayashi, both of Tokyo, Japan

[73] Assignee: Funai Electric Engineering Company Limited, Tokyo, Japan

[21] Appl. No.: 423,964

[22] Filed: Apr. 18, 1995

[30] Foreign Application Priority Data

Apr. 26, 1994 [JP] Japan .................... 6-110309
Oct. 3, 1994 [JP] Japan .................... 6-263208

[51] Int. Cl.$^6$ ............................................ H04B 1/40
[52] U.S. Cl. .................. 455/76; 455/113; 455/119; 455/260; 455/266; 331/16; 375/327; 375/376
[58] Field of Search ........................... 455/76, 77, 113, 455/114, 119, 260, 266, 343; 331/17, 16, 18, 1 A, 11; 375/327, 376

[56] References Cited

U.S. PATENT DOCUMENTS

| | | | |
|---|---|---|---|
| 4,009,455 | 2/1977 | Ishigaki et al. | 332/18 |
| 4,319,089 | 3/1982 | Miller | 179/6.06 |
| 4,591,914 | 5/1986 | Hakamada et al. | 358/190 |
| 4,774,480 | 9/1988 | Sato et al. | 331/1 A |
| 4,849,663 | 7/1989 | Kunze et al. | 307/521 |
| 5,021,749 | 6/1991 | Kasai et al. | 331/17 |
| 5,058,204 | 10/1991 | Tahernia et al. | 455/183 |
| 5,103,192 | 4/1992 | Sekine et al. | 331/1 A |
| 5,113,152 | 5/1992 | Norimatsu | 331/11 |
| 5,146,187 | 9/1992 | Vandegraaf | 331/17 |
| 5,170,130 | 12/1992 | Ichihara | 328/155 |
| 5,272,452 | 12/1993 | Adachi et al. | 331/17 |
| 5,389,899 | 2/1995 | Yahagi et al. | 331/10 |
| 5,424,689 | 6/1995 | Gillig et al. | 331/17 |
| 5,465,400 | 11/1995 | Norimatsu | 455/76 |

*Primary Examiner*—Reinhard J. Eisenzopf
*Assistant Examiner*—Lee Nguyen
*Attorney, Agent, or Firm*—Dellett and Walters

[57] ABSTRACT

The present invention relates to a wireless communication system having improved PLL circuits in the RF transmitter and receiver sections. The PLL circuits in the wireless communication system according to the present invention include time constant controllable filters. A series circuit of capacitor and resistor detects turn-on of the power switch for the PLL circuits to generate an output signal to be applied to the filters, thereby controlling the time constant of the filters in the PLL circuits to a lower value than normal for a given time after power-on of the PLL circuits.

2 Claims, 6 Drawing Sheets

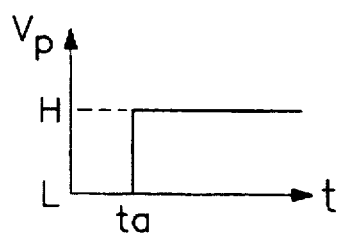
FIG.7(a)
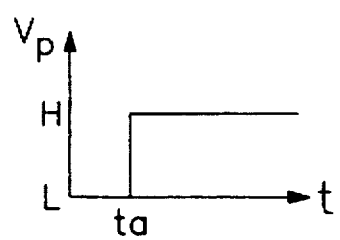
FIG.7(a-1)
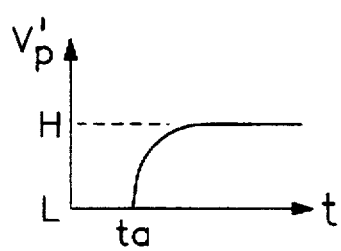
FIG.7(b)
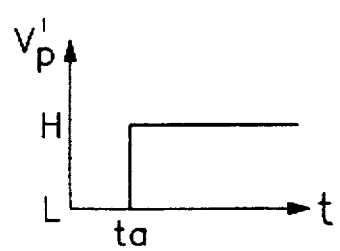
FIG.7(b-1)
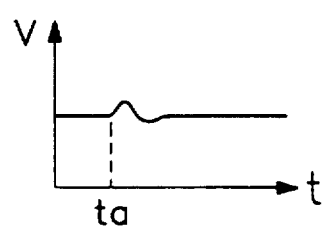
FIG.7(c)
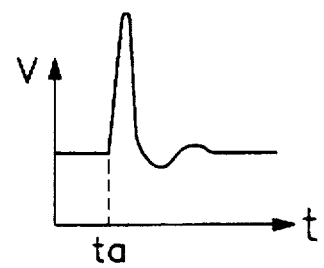
FIG.7(c-1)
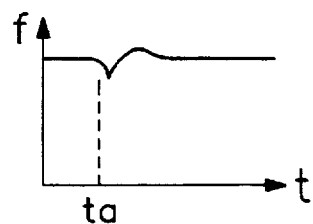
FIG.7(d)
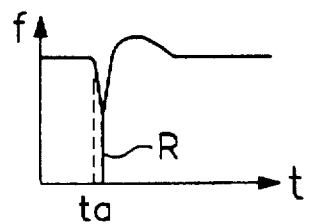
FIG.7(d-1)

5,794,130

WIRELESS COMMUNICATION SYSTEM HAVING IMPROVED PLL CIRCUITS

BACKGROUND OF THE INVENTION

1. (Field of Invention)

The present invention relates generally to a wireless communication system such as, for example, a portable wireless telephone system, more specifically to a wireless communication system with improved PLL (phase locked-loop) circuits in its transmitter and receiver sections.

2. (Prior Art)

In the conventional wireless communication system, e.g., a portable wireless telephone system, a carrier wave is modulated by an audio signal before being connected to a telephone line by way of wireless stations in the telephone network. In most recent years, not only audio signals but also data signals stored in memories in personal computers and the like are transmitted to the wireless communication system. In data communication, such data signals are connected to the telephone line by way of wireless stations similar to the audio signals. In this specification, a carrier wave modulated by data signals or audio signals is collectively referred to as a modulated carrier wave.

In the wireless communication system to transmit and receive such audio signals as well as data signals in personal computers and the like, data signals may contain lower frequency components down to tens of hertz (Hz) as compared with audio signals. The frequency may be even lower than that if many Zeros (0's) and Ones (1's) of digital signals continue.

Similarly to transmission operation of audio signals, transmission operation of such data signals is performed by supplying the data signals to be transmitted to a modulation circuit and generating a carrier wave locked by a reference signal driven by a PLL circuit simultaneously with the modulation. The carrier wave and the digital data signals are mixed to generate a modulated carrier wave before being transmitted from an antenna. The time constant of low pass filters within the PLL circuits was set in accordance with the audio signals.

Unfortunately, the low pass filters within the PLL circuit in the conventional wireless communication system having time constant adapted to the audio signals encounter a problem of requiring a relatively long time before locking the PLL circuits when low frequency signals in a data communication are applied.

One possible solution to this problem is to increase the time constant of the low pass filters to fit the data communication. However, this causes another problem to increase the time before locking the PLL circuits at the time of power-on. Normally, such time to lock the PLL circuits in such wireless communication system is set within about 500 mS but the time tends to exceed such setting.

SUMMARY OF INVENTION

The present invention intends to solve the above mentioned problems of the conventional wireless communication system.

It is, therefore, an object of the present invention to provide a wireless communication system capable of locking PLL circuits with minimum time after power-on and also quickly locking them to a data signal containing low frequency components.

It is another object of the present invention to provide a wireless communication system having PLL circuits which do not lose locking at the time of switching the time constant of the filters within the PLL circuits.

For this end, the wireless communication system according to the present invention includes RF transmitter and receiver sections and a signal processing circuit section for transmitting and receiving a modulated carrier wave modulated by an audio signal or a data signal. It features in the RF transmitter and receiver sections having PLL circuits with variable time constant filters and time constant control means to control the time constant of the filters. Additionally, the time constant control circuit means set the time constant of the filters to a relatively low value for a predetermined time immediately after power-on of the PLL circuits.

Also, in order to achieve the above objects, the wireless communication system according to the present invention having RF transmitter and receiver sections and a signal processing circuit section features in the RF transmitter and receiver sections comprising PLL circuits with variable time constant filters and time constant control means to control the time constant of the filters. The time constant control means is provided with a suppressor circuit to suppress sudden fluctuations in the output level from the filters when the time constant is switched.

BRIEF DESCRIPTION OF DRAWINGS

FIG. 4 shows operation waveforms of a switching circuit 37 in FIG. 3 at the time of power-on.

FIG. 7 shows operational waveforms of the suppressor circuit 38 in FIG. 6.

EMBODIMENTS

(First Embodiment)

Figure 1:
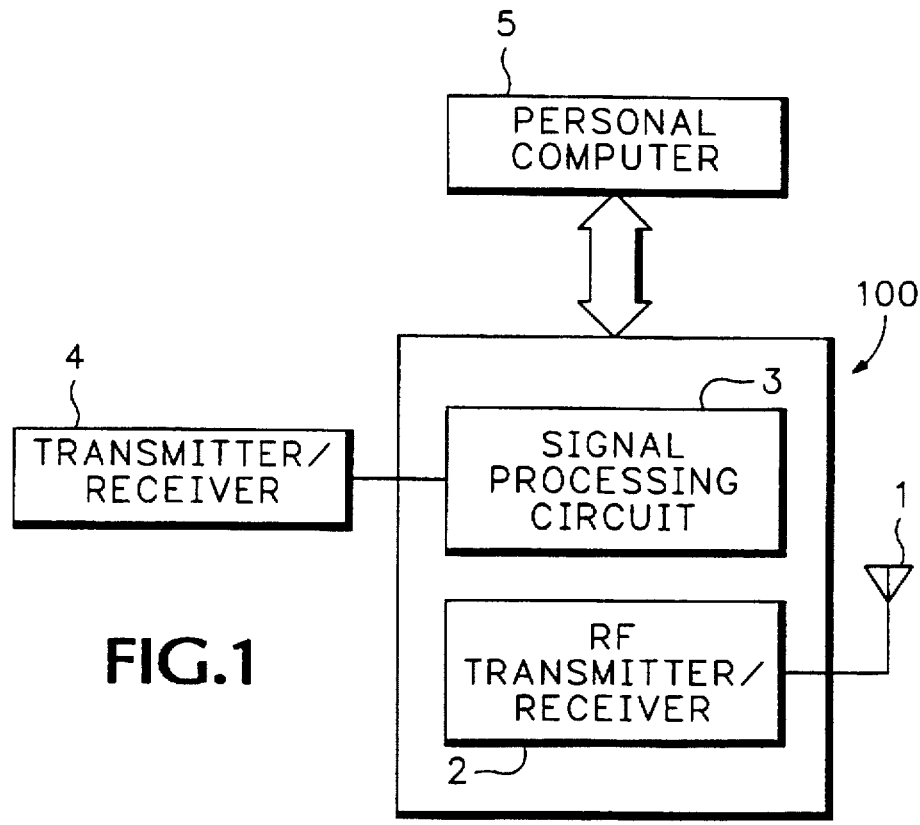
FIG. 1 is a general block diagram of the wireless communication system according to the present invention and its related devices.

As illustrated in FIG. 1, a wireless communication system 100 to which the present invention is applied is connected between a personal computer 5 and a transmitter/receiver 4. The wireless communication system 100 modulates a carrier wave by a data signal from the personal computer 5 and an audio signal from the transmitter/receiver 4 to carry out data communication and telephone communication by connecting to a telephone line by way of wireless stations (not shown).

The wireless communication system 100 comprises an antenna 1, an RF transmitter/receiver section 2 and a signal processing circuit 3. The antenna 1 receives a modulated carrier wave from wireless stations and transmits a modulated carrier wave to such wireless stations. The RF transmitter/receiver section 2 demodulates the modulated carrier wave received by the antenna 1 and generates a modulated carrier wave to be transmitted from the antenna 1. The signal processing circuit 3 processes the data signal from the personal computer 5 or the audio signal from the transmitter/receiver 4.

Figure 2:
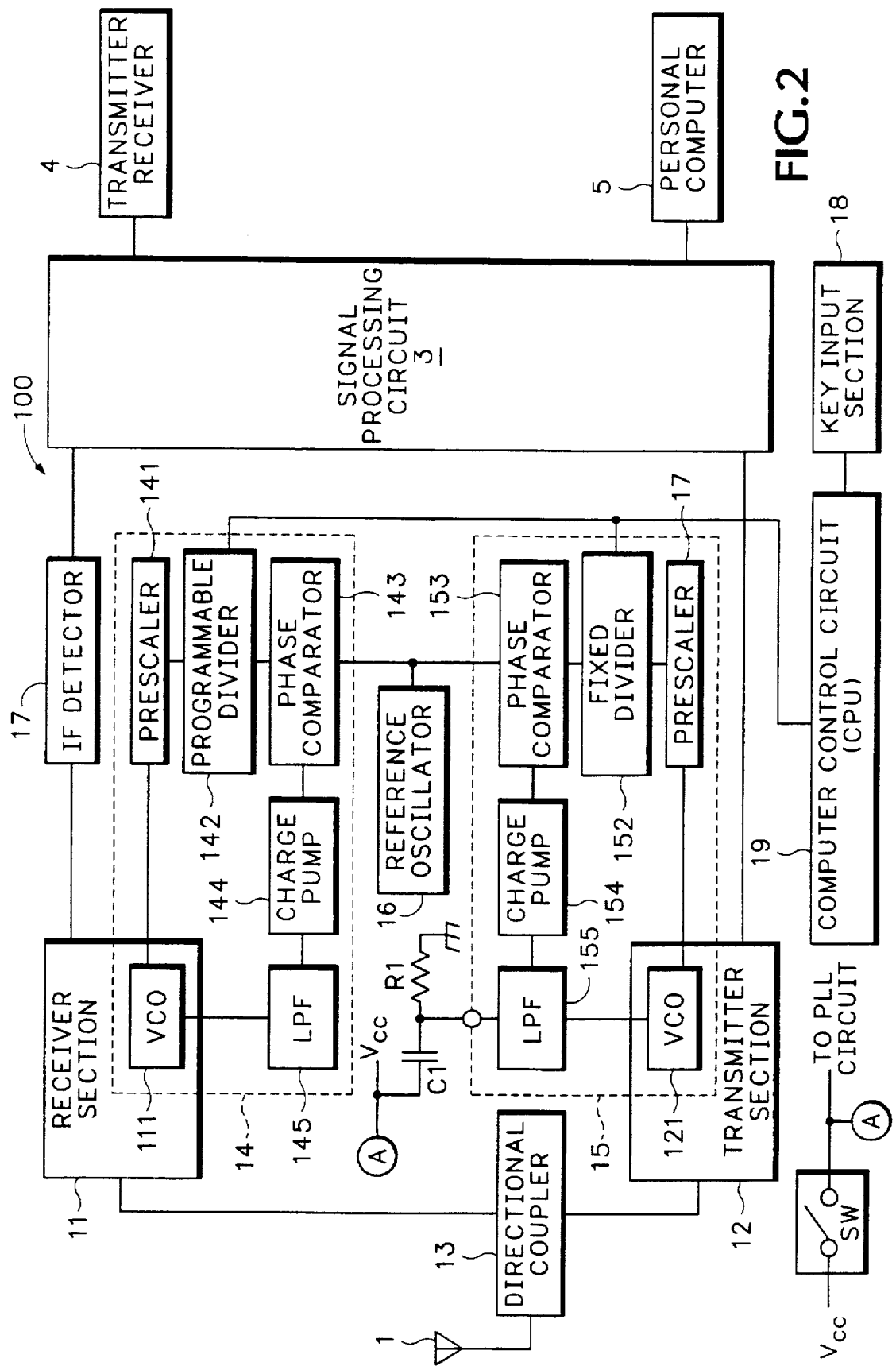
FIG. 2 is a block diagram of a first embodiment of the wireless communication system according to the present invention.

As best shown in FIG. 2, the wireless communication system 100 comprises a receiver section 11, a transmitter section 12, a directional coupler 13, a PLL circuit 14 for receiver section, a PLL circuit 15 for transmitter section and a reference oscillator 16. The receiver section 11 amplifies the received signal and converts it into an intermediate frequency. The transmitter section 12 modifies and amplifies the carrier wave by the audio signal or the data signal. The directional coupler 13 is disposed between the antenna 1 and both of the receiver section 11 and the transmitter section 12 for separating the receiving signal from the transmitting signal. The reference oscillator 16 supplies a reference signal to both PLL circuits 14, 15. Also provided in the wireless communication system 100 are an IF detector 17, a key input section 18 and a communication control circuit 19. The IF detector 17 detects the intermediate frequency (IF) signal from the receiving section 11. The communication control circuit 19 controls the entire wireless communication system 100.

Provided in the receiver section 11 is a voltage-controlled oscillator (VCO) 111 which generates a signal to convert the signal received by the antenna 1 and in turn by the receiving section 11 by way of the directional coupler 13 into an IF signal. Similarly, a VCO 121 is provided in the transmitter section 12. The VCO 121 generates a carrier wave to be modulated by the audio signal or the data signal from the signal processing circuit 3.

The PLL circuit 14 for receiver section comprises a VCO 111, a prescaler 141, a programmable divider 142, a phase comparator 143, a charge pump 144 and a low pass filter 145. The prescaler 141 divides the output from the VCO 111. The programmable divider 142 divides the output from the prescaler 141. The phase comparator 143 compares the phase of the outputs from the programmable divider 142 and the reference oscillator 16. The charge pump 144 converts the pulse width modulated output from the phase comparator 143 into an analog signal. The low pass filter 145 converts the output from the charge pump 144 into a DC voltage to be applied to the VCO 111 for controlling the output frequency. As a result, the VCO 111 generates a signal phase locked to the output from the reference oscillator 16.

Similarly, the PLL circuit 15 for transmitter section comprises a VCO 121, a prescaler 151, a fixed divider 152 for further dividing the output from the prescaler 151, a phase comparator 153, a charge pump 154 and a low pass filter 155. The phase comparator 153 compares the phase of the outputs from the fixed divider 152 and the reference oscillator 16. The charge pump 154 converts the pulse width modulated signal from the phase comparator 153 into an analog signal which is then converted into a DC control voltage by the low pass filter 155 for controlling the frequency of the VCO 121.

Figure 3:
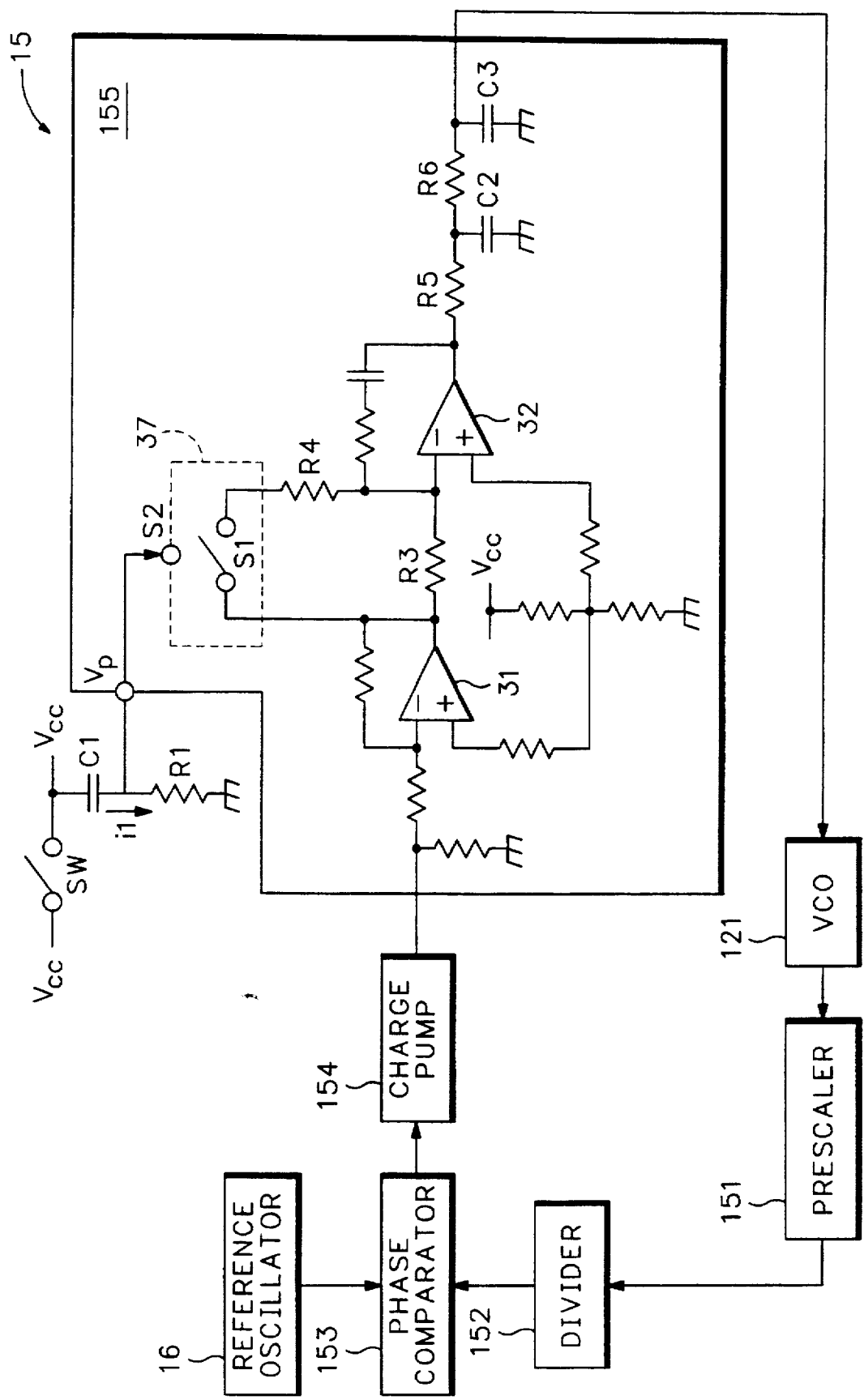
FIG. 3 illustrates a circuit arrangement of a low pass filter 155 and a series circuit of a capacitor $C_1$ and a resistor $R_1$ within a PLL circuit 15 in FIG. 2.

Applied to the PLL circuits 14, 15 is power supply voltage Vcc by way of a switch SW. Also, the voltage Vcc to the PLL circuits is applied to a series circuit of a capacitor $C_1$ and a resistor $R_1$ by way of the switch SW as illustrated in FIG. 3. A voltage divided by the series circuit is applied to the low pass filter 155 for controlling its time constant. It is to be noted that similar reference numerals are used to represent like elements in FIG. 2 and 3 and no duplicated description is given herein.

As shown in FIG. 3, the low pass filter 155 comprises a pair of operational amplifiers 31, 32 connected in a cascade manner, a resistor $R_3$ connected between the output terminal of the front stage operational amplifier 31 and the inverting input terminal of the subsequent stage operational amplifier 32 and resistors, etc. externally connected to these operational amplifiers 31, 32.

Also, connected between the output terminal of the operational amplifier 32 and the input terminal of the VCO 121 are a series connection of resistors $R_5$, $R_6$, a capacitor $C_2$ connected to ground from the common junction of the resistors $R_5$, $R_6$, and a capacitor $C_3$ connected between the input of the VCO 121 and ground.

A series circuit of a capacitor $C_1$ and a resistor $R_1$ is connected between the power supply Vcc and ground by way of a power switch SW. The junction of the capacitor $C_1$ and the resistor $R_1$ is connected to a control terminal $S_2$ of a switching circuit 37.

The switching circuit 37 is preferably an analog switch using, for example, a MOS or junction type FET (field effect transistor). The switching circuit 37 is designed to close a switch $S_1$ only when the voltage Vp to the control terminal $S_2$ is in its high ("H") level. In the transient period of the control voltage, the internal resistance of the switch $S_1$ depends on the voltage level of the control signal.

Connected between one end of the switch $S_1$ and the inverting input terminal of the operational amplifier 32 is a resistor $R_4$, thereby connecting the resistor $R_4$ in parallel with the resistor $R_3$ when the switch $S_1$ is closed. In the first embodiment, the resistance of the resistor $R_4$ is chosen to be low enough as compared with that of the resistor $R_3$.

Figure 4A:
Figure 4B:
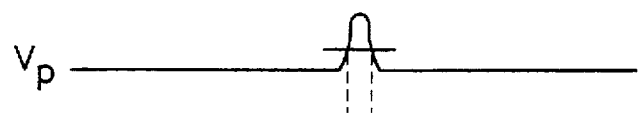
Figure 4C:
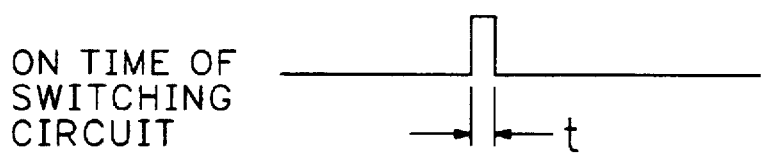

Now, the operation of the PLL circuit 15 in FIG. 3 will be described at the time of power-on. Illustrated in FIG. 4 are waveforms of the switching circuit 37 at the power-on. FIG. 4(a) shows how the power supply voltage Vcc increases when turning on the power switch SW. When the voltage Vcc rises, a power-on current $i_1$ flows through the capacitor $C_1$ and the resistor $R_1$ into ground, thereby developing a voltage pulse Vp in a spike form on the common junction of the resistor $R_1$ and the capacitor $C_1$ as shown in FIG. 4(b). The spike voltage pulse Vp is then applied to the control terminal $S_2$ of the switching circuit 37. The switch $S_1$ in the switching circuit 37 closes only a short time $t_1$ when the spike voltage pulse Vp exceeds a predetermined level as shown in FIG. 4(c).

As a result, the resistors $R_3$ and $R_4$ are connected in parallel with each other during the time duration t. Since the resistance of the resistor $R_4$ is chosen to be sufficiently lower than that of the resistor $R_3$ as mentioned above, the time constant of the low pass filter 155 is switched to a lower time constant $T_1$ essentially determined by the resistor $R_4$ during the time t. This, in turn, increases the response time of the PLL circuit 15 to the output from the phase comparator circuit 153, thereby enabling the PLL circuit 15 to be locked quickly in the time t immediately after power-on.

However, at the time t after power-on, the control voltage on the control terminal $S_2$ of the switching circuit 37 returns to the ground level, thereby opening the switch $S_1$ in the switching circuit 37. Under this normal condition, the resistor $R_4$ is disconnected from the resistor $R_3$ and the low pass filter 155 operates with a larger time constant $T_2$ corresponding to the resistor $R_3$. The time constant $T_2$ is effective to stably develop a DC voltage to signals containing relatively low frequency components such as data signals in the personal computer 5 and is used to control the VCO 121.

As apparent from the above description, the first embodiment of the present invention features in comprising the series circuit of the capacitor $C_1$ and the resistor $R_1$ the switching circuit 37, and the time constant control means of the resistors $R_3$ and $R_4$. The time constant of the low pass filter 155 in the transmitter PLL circuit 15 is set to low for the time duration t immediately after power-on and returning to the normal high level thereafter. As a result, the PLL circuit 15 is able to establish locking within a given time (about 500 mS) to not only signals not containing low frequency components but also data signals containing low frequency components after power-on. Also, it is quickly locked to data signals containing relatively low frequency components for developing a DC voltage to control the VCO 121.

(Second Embodiment)

Figure 5:
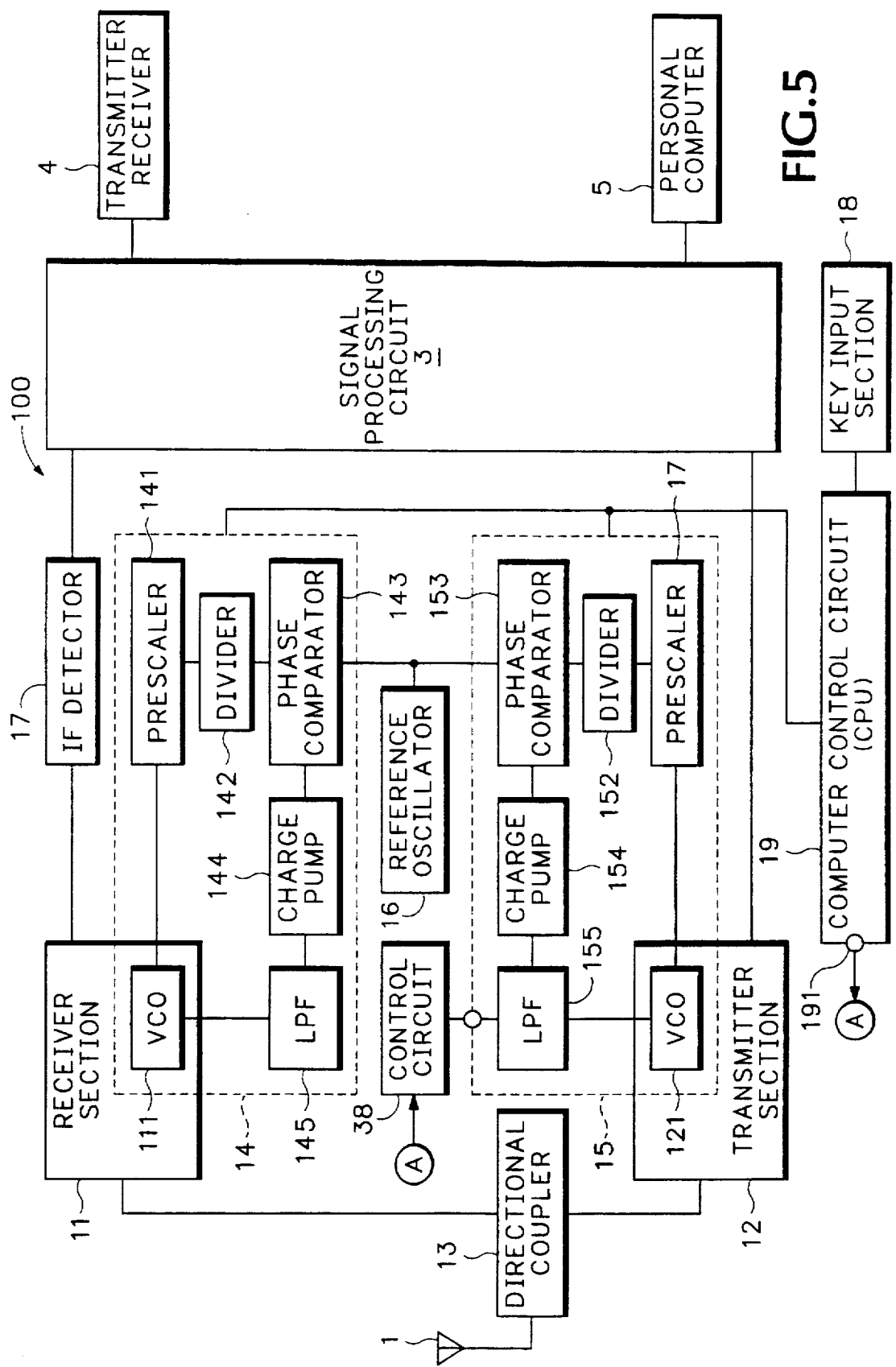
FIG. 5 is a block diagram of a second embodiment of the wireless communication system according to the present invention.

Illustrated in FIG. 5 is a block diagram of the second embodiment of the present invention. In FIG. 5, identical reference numerals to the first embodiment are used to represent like or corresponding elements. The second embodiment differs from the first embodiment in the time constant control circuit of the low pass filter 155. More specifically, in the second embodiment, a switching voltage from a time constant control port 191 for the low pass filter in the communication control circuit 19 is applied to the suppressor circuit 38 so that the output voltage from the suppressor circuit 38 controls the time constant of the low pass filter 155. Simultaneously, the PLL circuit 15 is prevented from running out of locking at the switching of the time constant of the low pass filter 155.

Figure 6:
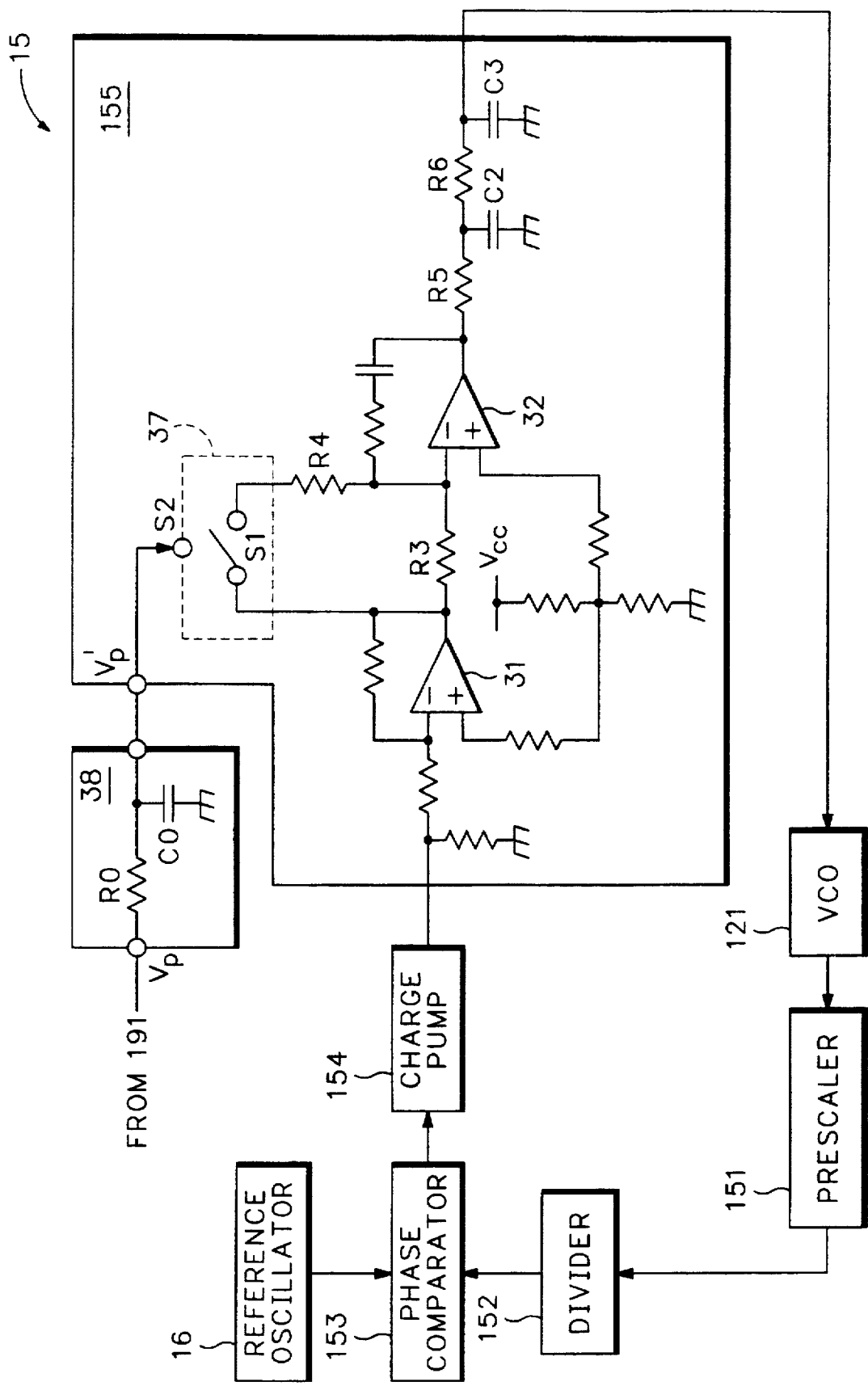
FIG. 6 is a circuit diagram of a low pass filter 155 in a PLL circuit 15 in FIG. 5 and a suppressor circuit 38 connected to the low pass filter 155.

Shown in FIG. 6 is a circuit diagram of the low pass filter 155 in the PLL circuit 15 in FIG. 5 and the connection relationship between the low pass filter 155 and the suppressor circuit 38. In FIG. 6, the identical or equivalent portions to FIG. 3 are shown with like reference numerals and description of such portions will not be given herein.

As shown in FIG. 6, the suppressor circuit 38 comprises, for example, a resistor Ro and a capacitor Co connected in series between the time constant control port 191 for the low pass filter and the low pass filter 155.

The suppressor circuit 38 helps to convert any rapid level change in time of the input voltage Vp into a relatively slow level change of an output voltage Vp'. In this way, the suppressor circuit 38 contributes to suppress to shock noise which is generated by on-off operation of the switch $S_1$ in the switching circuit 37 for varying the time constant of the low pass filter 155.

Now, here is a description of the operation of the PLL circuit 15 in FIG. 6 by reference to waveforms as shown in FIG. 7. FIG. 7(a) through (d) show the relationships of the switching voltage Vp in the PLL circuit, the voltage Vp' to be applied to the control terminal $S_2$ of the switching circuit 37, the control voltage to the VCO 121 and the output frequency of the VCO 121 in the second embodiment having the suppressor circuit 38. Also shown in FIG. 7(a') through (d') are corresponding reference waveforms excluding the suppressor circuit 38. Operations will be described hereunder by comparing the waveforms in FIG. 7(a) through (d) and FIG. 7(a') through (d') including and excluding the suppressor circuit 38, respectively.

When the time constant of the low pass filter 155 of the PLL circuit 15 in the wireless communication system 100 is going to be varied, a switching signal is generated from the time constant control port 191 for the low pass filter in the communication control circuit 19 for controlling the system in FIG. 5. For example, at the time of power-on and transmitting data signals, the switching signal Vp is switched from low ("L") level to high ("H") level at the time ta as shown in FIG. 7(a) and FIG. 7(a').

When the voltage Vp' on the control terminal $S_2$ of the switching circuit 37 is "L" level, the switch $S_1$ is open. It closes on receiving the switching signal of "H" level. As shown in comparison in FIG. 7(b) and FIG. 7(b'), the voltage Vp' on the control terminal $S_2$ of the switching circuit 37 increases gradually in time when the suppressor circuit 38 is included. On the other hand, the voltage Vp' rises very sharply and is essentially the same waveform as the voltage Vp if no suppressor circuit 38 is included as shown in FIG. 7(b').

In case of the sharp increase of the voltage Vp' as shown in FIG. 7(b'), a large magnitude of shock noise occurs at that time. Such large amplitude of shock noise is applied to the low pass filter 155 in superimposed relationship with the DC signal component generated by the charge pump 154 for application to the control input terminal of the VCO 121. If the suppressor circuit 38 is not included, the frequency control voltage to the VCO 121 will be as shown in FIG. 7(C').

If the suppressor circuit 38 is included, however, the voltage Vp' rises gradually to suppress the amplitude of the shock noise, thereby establishing a relatively smooth control voltage to the VCO 121 as shown in FIG. 7(c).

This means that the oscillation frequency of the VCO 121 varies significantly in accordance with a large change in the frequency control voltage to be applied to the control input terminal of the VCO 121. If the suppressor circuit 38 is not included, the oscillation frequency from the VCO 121 varies significantly by the large amplitude of the shock noise as shown at a point R in FIG. 7(d'), thereby losing the locking of the PLL circuit near the point R.

In contrary, it is to be noted that the use of the suppressor circuit 38 helps to minimize the change in oscillation frequency of the VCO 121 by the shock noise as shown in FIG. 7(d), thereby maintaining the locking of the PLL circuit.

In other words, the second embodiment avoids the loss of locking of the PLL circuit 15 at the switching operation of the switching circuit 37 as shown in FIG. 7(d), thereby minimizing the time required for establishing the locked condition and realizing high speed operation of the PLL circuit.

It is to be understood that the above descriptions are equally applicable to switching the time constant of the low pass filter in the PLL circuit for receiver section in both of the first and second embodiments.

What is claimed is:

1. A wireless communication system including RF transmitter and receiver sections and a signal processing circuit section and transmitting and receiving a carrier wave modulated by an audio signal or a data signal characterized in that:

said RF transmitter and receiver sections comprise PLL circuits having time constant controllable filters and time constant control means for controlling the time constant of said filters; and said time constant control means are provided with suppressor circuits for suppressing sharp level changes from said filters when switching the time constant, wherein said time constant controllable filters have switches to be on-off controlled by a time constant switching signal having a given level and said suppressor circuits smooth out level changes in time in the time constant switching signal.

2. A wireless communication system of claim 1, wherein said suppressor circuits comprise capacitor-resistor circuits to smooth out level changes in time in the time constant switching signal.

* * * * *